(12) United States Patent
Kim

(10) Patent No.: US 7,094,644 B2
(45) Date of Patent: Aug. 22, 2006

(54) METHOD FOR MANUFACTURING A SEMICONDUCTOR DEVICE

(75) Inventor: Hak-yun Kim, Chungcheongbuk-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 34 days.

(21) Appl. No.: 10/839,845

(22) Filed: May 6, 2004

(65) Prior Publication Data
US 2005/0014333 A1   Jan. 20, 2005

(30) Foreign Application Priority Data
Jul. 16, 2003   (KR)   ............... 10-2003-0048846

(51) Int. Cl.
*H01L 21/336*   (2006.01)
(52) U.S. Cl. .................. 438/259; 438/296; 438/589
(58) Field of Classification Search .................. None
See application file for complete search history.

(56) References Cited

U.S. PATENT DOCUMENTS

| 6,221,718 B1 | 4/2001 | Hong |
| 6,413,809 B1 * | 7/2002 | Nakamura et al. ........... 438/201 |
| 6,531,733 B1 | 3/2003 | Jang |
| 6,642,108 B1 | 11/2003 | Lee et al. |
| 6,682,977 B1 * | 1/2004 | Chang ........................ 438/257 |

* cited by examiner

*Primary Examiner*—Chandra Chaudhrai
(74) *Attorney, Agent, or Firm*—Marshall, Gerstein & Borun LLP

(57) ABSTRACT

The present invention discloses a method for manufacturing a flash memory cell by using a trench method which can eliminate an increase of a stepped portion in a flash process as compared to a logic process by forming a floating gate on a STI portion since the floating gate is added to the flash memory as compared to a logic process. The method comprises the steps of: forming a plurality of trenches on both sides of the center of a silicon substrate; forming a trench isolation by filling the trenches with an insulating material; controlling a bonding ratio between floating gates by controlling the width and depth of the trench isolation at the both sides of the silicon where a tunnel oxide film grows within one cell; depositing a tunnel oxide film and then performing a well formation and a threshold voltage ion implantation; forming a floating gate within the trench isolations by depositing a floating gate polysilicon and then patterning the same into a predetermined shape; sequentially forming an ONO layer and a control gate poly on the patterned floating gates; and forming a control gate by sequentially etching the control gate poly and the ONO layer.

6 Claims, 6 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly, to a method for manufacturing a flash memory cell by using a trench method which can acquire a margin of subsequent processes as well as making a logic and a flash memory into one chip by forming a floating gate of the flash memory within a shallow trench isolation (STI).

2. Description of the Related Art

In the prior art, the floating gate of a flash memory is formed on a Si wafer, thus a height generated upon forming the floating gate imposes a burden on a contact process and becomes more serious as the process technique becomes finer. Further, from the viewpoint of making one chip with logic, an increase in the stepped portion during a logic process and a flash memory process causes a reduction in the margin of a contact process and the subsequent processes.

SUMMARY OF THE INVENTION

The present invention is designed in consideration of the problems of the prior art, and therefore it is an object of the present invention to provide a method for manufacturing a flash memory cell by using a trench method which can eliminate an increase of a stepped portion in a flash process as compared to a logic process by forming a floating gate, which is to be added to the flash memory, at a STI portion.

To achieve the above object, there is provided a method for manufacturing a flash memory cell using a trench method according to the present invention, comprising the steps of: forming a plurality of trenches on both sides of the center of a silicon substrate; forming a trench isolation by filling the trenches with an insulating material; controlling a bonding ratio between floating gates by controlling the width and depth of the trench isolation at the both sides of the silicon where a tunnel oxide film grows within one cell; depositing a tunnel oxide film and then performing a well formation and a threshold voltage ion implantation; forming a floating gate within the trench isolations by depositing a floating gate polysilicon and then patterning the same into a predetermined shape; sequentially forming an oxide-nitride-oxide (ONO) layer and a control gate poly on the patterned floating gates; and forming a control gate by sequentially etching the control gate poly and the ONO layer.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENT

Figure 1A:
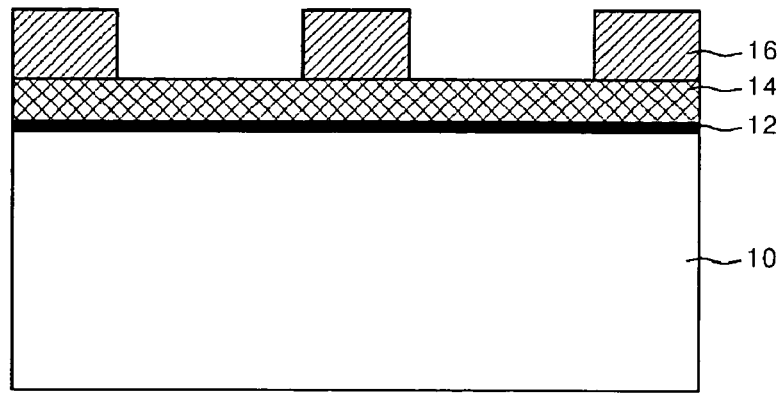
FIG. 1a to 1n show sectional views for explaining a flash memory cell formed by a method for manufacturing a flash memory cell by using a trench method in accordance with a preferred embodiment of the present invention.

Hereinafter, a preferred embodiment of the present invention will be described in more detail referring to the drawings. In addition, the following embodiment is for illustration only, not intended to limit the scope of the invention.

Figure 1B:
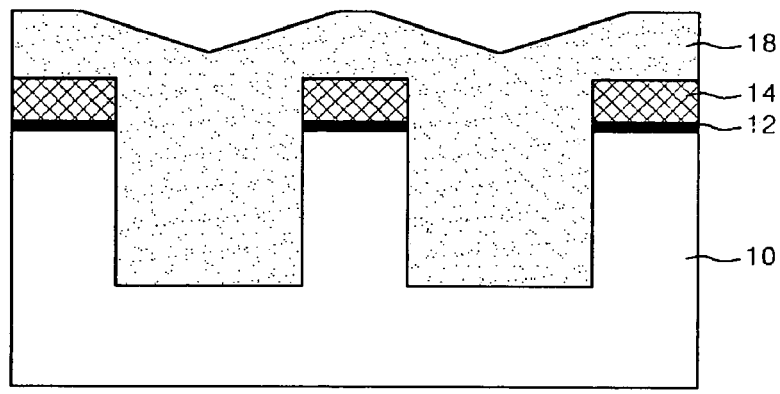
Figure 1C:
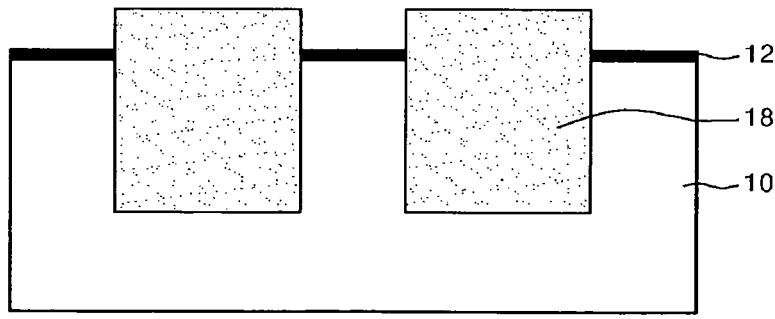
Figure 1D:
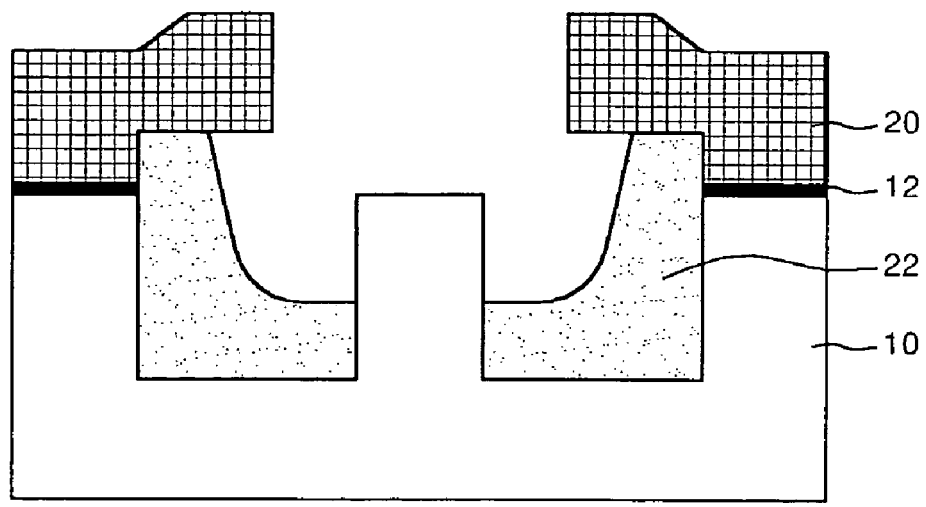
Figure 1E:
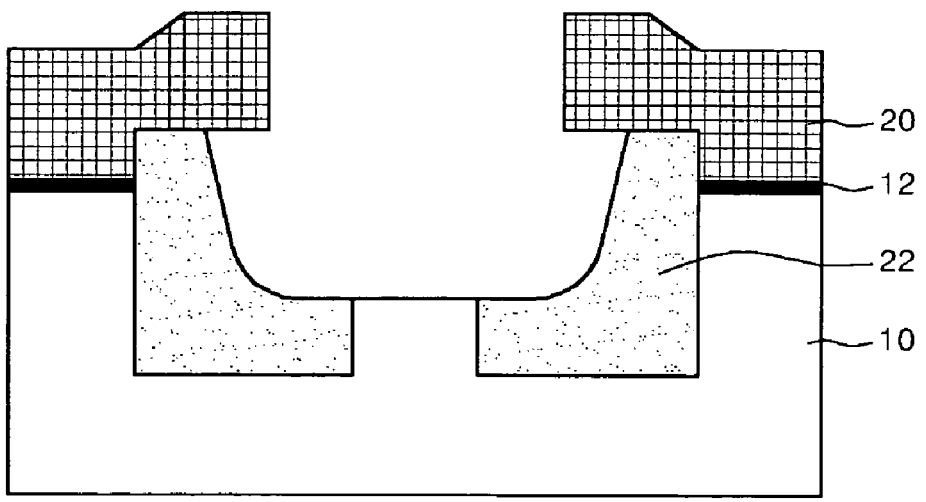
Figure 1F:
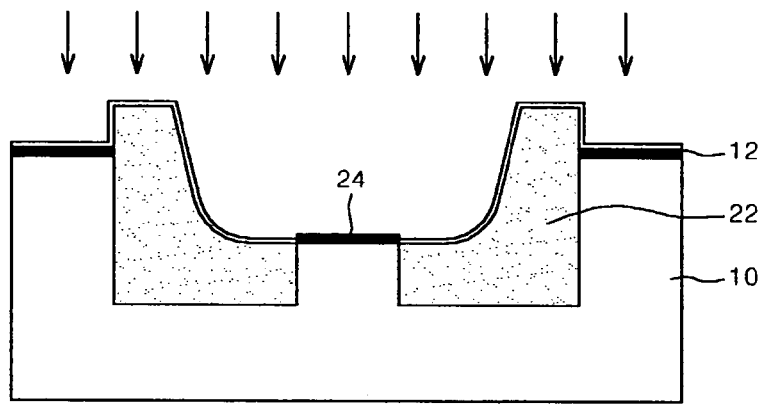
Figure 1G:
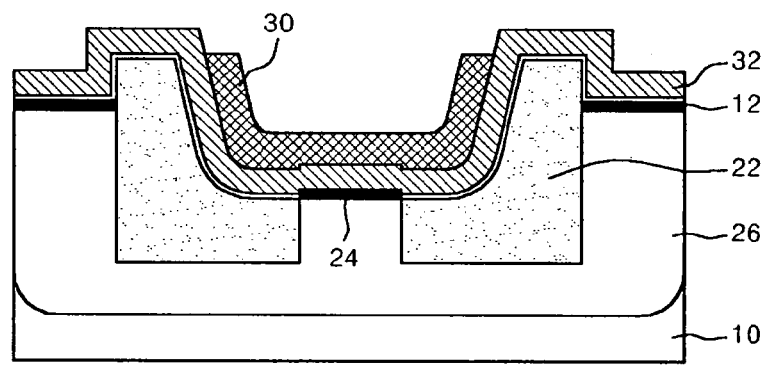
Figure 1H:
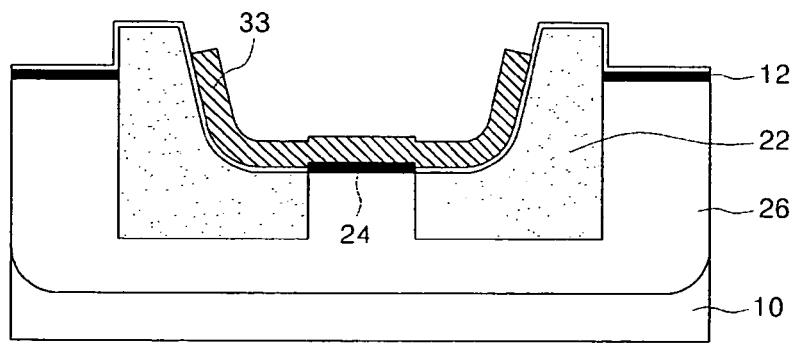
Figure 1I:
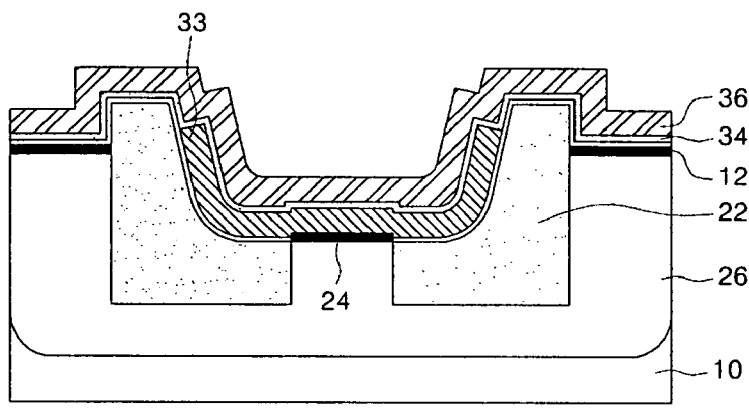
Figure 1J:
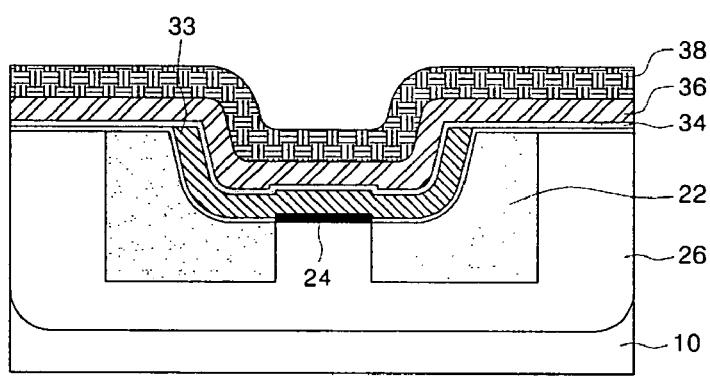
Figure 1K:
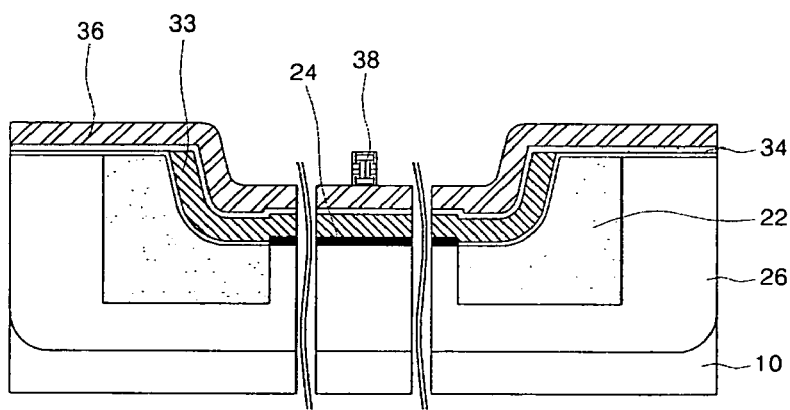
Figure 1L:
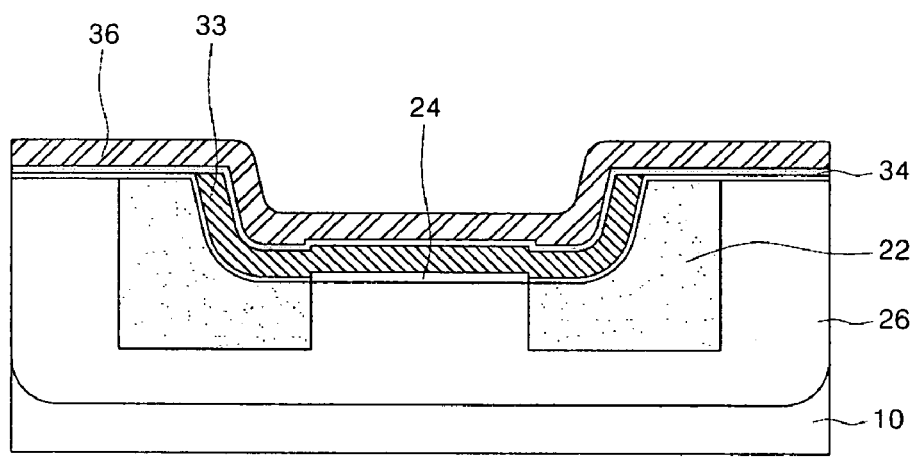
Figure 1M:
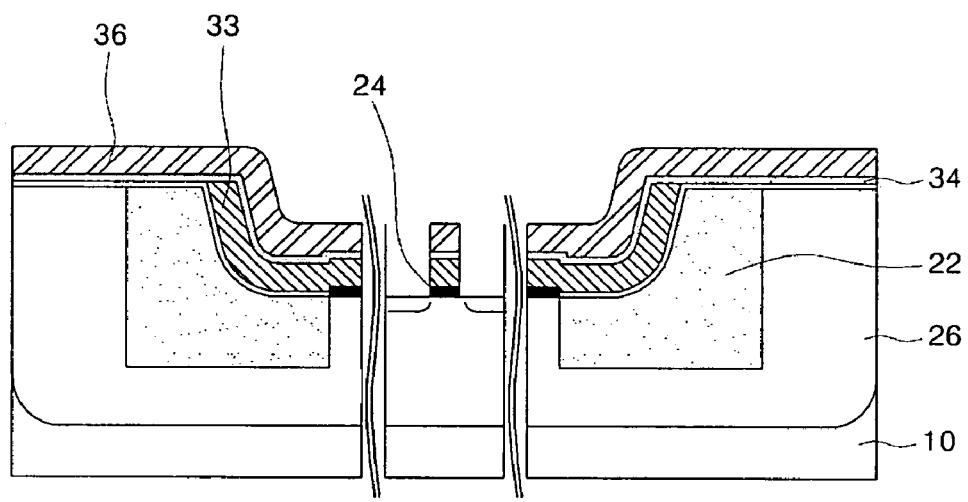
Figure 1N:
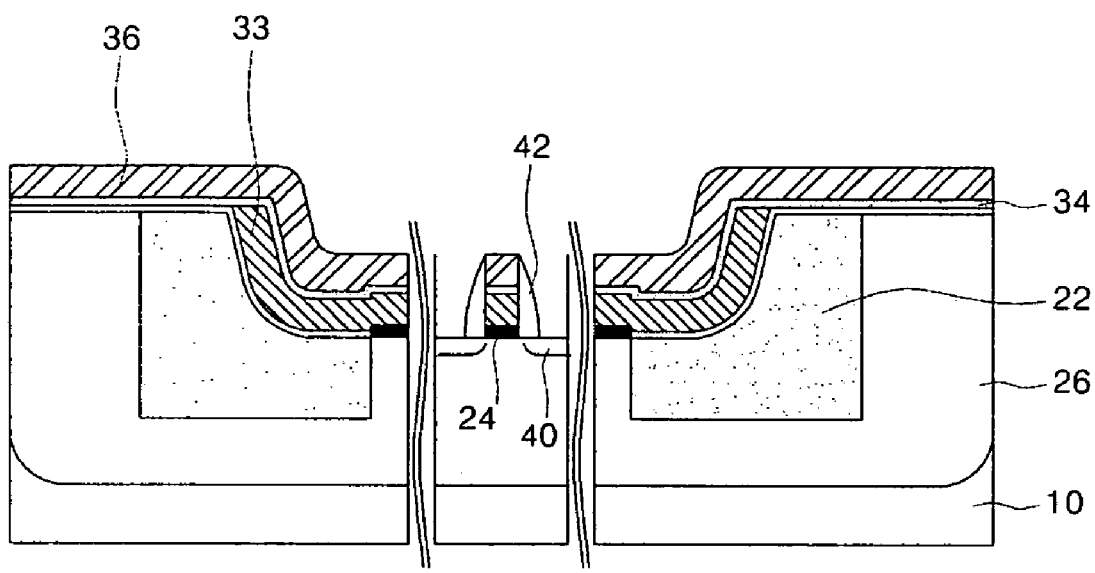

FIGS. 1a to 1n show sectional views for explaining a flash memory cell formed by a method for manufacturing a flash memory cell by using a trench method in accordance with a preferred embodiment of the present invention.

Firstly, as shown in FIG. 1a, a pad oxide film 12, a pad nitride film 14 and a photoresist 16 are sequentially formed on a silicon substrate 10. Then, with the photoresist 16 left on the portion where a floating gate is to be formed in a STI photo process, a silicon etching is carried out to form trenches.

Then, as shown in FIG. 1b, an insulating material of an oxide film family is buried in the trenches in order to form an isolation 18.

Continually, as shown in FIG. 1c, a planarization process is carried out by using a process such as chemical mechanical polishing (CMP), to obtain the isolation 18.

Next, as shown in FIGS. 1d and 1e, in order to increase the contact area between a floating gate and a control gate and form a flash cell active, a second photoresist pattern 20 of a predetermined shape is formed on the silicon substrate 10 where the isolation 18 is formed.

Then, using the second photoresist pattern 20 as an etching mask, an isolation 22 as shown in FIG. 1d is formed. Afterwards, through another etching process, the protruded silicon substrate is removed as shown in FIG. 1e.

Then, as shown in FIG. 1f, a tunnel oxide film 24 is deposited, and then a well formation and a threshold voltage ion implantation (Vt implant) are performed to form a well 26 (FIG. 1g).

Continually, as shown in FIG. 1g, a floating gate polysilicon 32 is formed on the silicon substrate 10 where the tunnel oxide film 24 is formed.

Then, as shown in FIG. 1h, in order to pattern the floating gate polysilicon 32 into a predetermined shape, a photomask is formed, then patterned, and then the floating gate polysilicon 32 is etched using the patterned photomask 30, thereby finally forming a floating gate 33 within a trench isolation.

Continually, as shown in FIG. 1i, an oxide-nitride-oxide (ONO) dielectric material 34 is deposited on the silicon substrate 10 where the floating gate 33 is formed, and then a control gate polysilicon 36 is formed on the oxide-nitride-oxide dielectric material 34 by deposition.

In the following step, as shown in FIGS. 1j and 1k, a photoresist 38 is formed in a predetermined shape in order to perform a photo process for forming a control gate. At this time, a world line direction sectional view is shown in FIG. 1j, and a channel direction sectional view is shown in FIG. 1k.

Then, as shown in FIGS. 1l and 1m, using a photoresist 38 having a predetermined pattern as a mask, an etching process is performed, thereby patterning the control gate polysilicon 36, the oxide-nitride-oxide dielectric material 34 and the tunnel oxide film 24 in a predetermined shape. At this time, a word line direction sectional view is shown in FIG. 1l, and a channel direction sectional view is shown in FIG. 1m.

In the final step, as shown in FIG. 1n, a lightly doped drain (LDD) spacer 42 is formed on the sides of the control gate polysilicon 36, oxide-nitride-oxide dielectric material 34 and tunnel oxide film 24 all patterned into the predetermined shape, thereby completing a gate structure. And, n+ junctions 40 are formed below the sides of the gate structure, thereby completing the method for manufacturing a flash memory cell by using a trench method.

As described above, the present invention can acquire an electric margin of a contact process of a logic portion when manufacturing one chip of a logic and flash memory by forming a floating gate within a trench isolation.

Furthermore, the present invention can form a logic gate simultaneously with the formation of a control gate by forming a floating gate within a trench isolation.

While the present invention has been particularly shown and described with reference to the embodiments, it will be understood by those skilled in the art that various changes in form and detail may be made without departing from the spirit, scope, and teachings of the invention.

What is claimed is:

1. A method for manufacturing a flash memory cell by using a trench method, comprising the steps of:
    forming a pair of trenches spaced from each other in a silicon substrate;
    forming spaced trench isolations by filling the trenches to form recessed trench isolations;
    recessing facing portions of the trench isolations;
    etching a portion of the silicon substrate between the recessed trench isolations;
    depositing a tunnel oxide film on the portion of the silicon substrate, between the recessed trench isolations;
    forming a floating gate on the tunnel oxide film, extending to cover the recessed portion of the trench isolations;
    forming an oxide-nitride-oxide (ONO) layer to cover the floating gate; and
    forming a control gate on the ONO layer;
    wherein a coupling ratio between the floating gate and the control gate depends on recessed widths and depths into the trench isolations.

2. The method of claim 1, further comprising the step of sequentially forming a pad oxide film and a pad nitride film on the silicon substrate before forming the trench.

3. The method of claim 1, wherein the trench isolation comprising an oxide film.

4. The method of claim 1, wherein the etching is performed to lower an etched surface of the portion of the substrate to a surface level of the recessed trench isolations.

5. The method of claim 1, further comprising forming a lightly doped drain (LDD) spacer on the sides of the control gate.

6. The method of claim 5, further comprising forming n+ junctions in the silicon substrate besides the LDD spacer.

* * * * *